(12) United States Patent
Nakasuji et al.

(10) Patent No.: US 7,227,141 B2
(45) Date of Patent: Jun. 5, 2007

(54) ELECTRON BEAM APPARATUS

(75) Inventors: Mamoru Nakasuji, Kanagawa-ken (JP); Takao Kato, Tokyo (JP); Tohru Satake, Kanagawa-ken (JP); Nobuharu Noji, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/619,192

(22) Filed: Jul. 15, 2003

(65) Prior Publication Data
US 2004/0113073 A1 Jun. 17, 2004

(30) Foreign Application Priority Data
Jul. 15, 2002 (JP) .............................. 2002-205220
Oct. 30, 2002 (JP) .............................. 2002-316303
Nov. 27, 2002 (JP) .............................. 2002-343473

(51) Int. Cl.
H01J 37/28 (2006.01)
(52) U.S. Cl. .................... 250/310; 250/396 R
(58) Field of Classification Search ............... 250/310, 250/306, 396 R
See application file for complete search history.

(56) References Cited

U.S. PATENT DOCUMENTS 5,892,224 A 4/1999 Nakasuji .................... 250/310
6,023,060 A * 2/2000 Chang et al. ............... 250/310
6,411,377 B1 6/2002 Noguchi et al. ......... 356/237.4
6,593,152 B2 7/2003 Nakasuji et al. .............. 438/14
7,049,585 B2 * 5/2006 Nakasuji et al. ............ 250/310

OTHER PUBLICATIONS

Shinada, H. et al. "High Speed and Large-Current Electron Optics for Wafer Inspection", Proceedings LSI Testing Symposium/2000 Conference Minutes, pp. 151-156.

* cited by examiner

Primary Examiner—Kiet T. Nguyen
(74) Attorney, Agent, or Firm—Westerman, Hattori, Daniels & Adrian, LLP.

(57) ABSTRACT

An electron beam apparatus is provided in which a sample is scanned with a plurality of primary electron beams respectively emitted from a plurality of electron guns. Each of the electron guns comprises a mechanism for adjusting a relative position between a cathode and anode. The adjusting mechanism of each of the electron guns comprises an insulator for supporting the cathode and a plurality of piezo elements for supporting the insulator. The piezo element varies its length in response to a voltage applied thereto. Therefore, the position of the cathode is adjustable relative to the anode position, by controlling voltages applied to the piezo elements.

3 Claims, 14 Drawing Sheets

ELECTRON BEAM APPARATUS

BACKGROUND OF THE INVENTION

The present invention relates to an electron beam apparatus for inspecting a pattern or the like formed on a surface of a sample, and more particularly to an electron beam apparatus for reliably inspecting a wafer or a mask having a pattern with a minimum line width of 0.1 µm or less at a high throughput.

Conventionally, an electron gun using a Schottky cathode has been employed for inspecting a sample for defects on a pattern having a size of 0.1 µm or less. For example, Hiroyuki Shinada et al. "High-Speed Large-Current SEM Optical System for Inspecting Wafers," Proceedings of LSI testing symposium/2000 (Nov. 9-10, 2000), pp. 151-156 discloses a SEM using a Schottky cathode electron source, which is capable of effectively inspecting a wafer for defects even if the wafer has electric defects such as circuit-short, circuit opening and the like occurring during a forming step and a wiring step in underlying layers of the wafer.

An apparatus and method for inspecting a sample for defects is known in which a plurality of primary electron beams (or charged particle beams) are generated around a single optical axis. For example, U.S. Pat. No. 5,892,224 discloses an apparatus for inspecting a sample such as a mask, reticle or the like, in which the sample is simultaneously irradiated with a plurality of primary electron beams around one optical axis and a plurality of secondary electrons emitted from the sample are detected. Another apparatus for inspecting a sample has been proposed in which a plurality of electron guns are employed to irradiate a plurality of electron beams that are guided to the sample through a plurality of optical systems associated therewith.

It is to be noted that the entire contents of Hiroyuki Shinada et al. and U.S. Pat. No. 5,892,225 are incorporated herein by this description.

As described above, the SEM optical system in Shinada et al. employs a Schottky cathode as an electron gun. However, such a Schottky cathode based electron gun is a problematic in that it generates a large noise. To overcome this problem of providing a signal with a high S/N ratio, a sample must be irradiated with an electron beam of high irradiation, which could however damage the sample.

The electron beam apparatus disclosed in U.S. Pat. No. 5,892,224 can reduce an inspection time by virtue of the use of a plurality of primary electron beams. However, this apparatus has only one optical axis and, as a result, the primary electron beams are formed at respective positions away from the optical axis, resulting in a relatively large aberration. For this reason, when the respective electron beams are narrowed down to a certain size, resulting beam currents are smaller than a beam current of an electron beam which lies on the optical axis. Also, the electron beam apparatus requires a relatively complicated optical system for guiding and detecting secondary electrons, and which makes it difficult to detect the secondary electrons at a rate approaching 100%. Further, difficulties are experienced in using the apparatus to adjust the primary electron beams independently of one another, and as a consequence, it is difficult to match the magnitudes of the primary electron beams.

In an electron beam apparatus which comprises a plurality of electron guns for simultaneously emitting a plurality of primary electron beams, the use of thermal electron emission cathodes for the electron guns could lead to excessive heat being generated by the electron guns. If the electron guns are thermaled to such an extent to damage the stability of a system, each unit comprising primary and secondary optical systems encounters a problem of a lower degree of vacuum. Further, a thermaled or hotted electron emission cathode gives rise to a problem of a change in relative position between the thermal electron emission cathode and an anode.

A conventional exemplary electron beam apparatus forms an image comprised of pixels, each of which has dimensions or sizes equal to or smaller than the sizes of intended defects, and detects any defects from the formed image. For example, in detecting defects having a size of 0.05 µm or more on a pattern having a line width of 0.1 µm, the pixel size must be set to 0.05 µm or less. Also, in this event, if a clock frequency of 100 MHz (a scanning speed) is utilized to detect defects, a detection time period per $cm^2$ is calculated as follows:

$$10^2/\{(5\times10^{-5})^2\times100\times10^6\}$$

$$=400 \text{ seconds}$$

$$\approx 0.111 \text{ hours}$$

Therefore, in inspecting an area of 100 $cm^2$ to detect defects thereon, 11.1 hours will be required even a simple calculation is employed.

While the foregoing example employs a clock frequency of 100 MHz, this clock frequency can be employed only in an electron beam apparatus which comprises a secondary electron beam detector having a response frequency sufficiently higher than 100 MHz.

For detecting defects of similar sizes to those of pixels, Shinada et al. teaches that an electron beam apparatus must provide an S/N ratio of 15 or higher where the noise is 3 s value. However, scanning is generally impossible at a clock frequency of 100 MHz or higher in a secondary electron beam detector, for example, when implemented by a combination of a scintillator and PMT, which does not provide a very high response frequency. Thus, an electron beam apparatus using such a secondary electron beam detector suffers from a problem in that it requires a long inspection time period and achieves a lower throughput, because it must scan a sample at a clock frequency lower than 100 MHz.

SUMMARY OF THE INVENTION

The present invention has been accomplished in view of the foregoing problems of prior arts.

It is an object of the present invention to provide an electron beam apparatus which is capable of adjusting a relative position between a cathode and an anode, even if the relative position varies due to a rise in temperature or the like, and is capable of preventing vacuum parts other than the cathode from being thermaled when the cathode is subjected to heating.

It is another object of the present invention to provide an electron beam apparatus which is capable of minimizing an aberration of each electron beam by providing an electro-optical means for irradiating a sample with a plurality of electron beams in alignment with associated optical axes on the sample.

It is a further object of the present invention to provide an electron beam apparatus which is capable of detecting secondary electrons at a detection efficiency close to 100%.

It is a still further object of the present invention to provide an electron beam apparatus which is capable of adjusting strengths of primary electron beams independently of one another, so that respective strengths thereof can be readily matched.

It is yet another object of the present invention to provide an electron beam apparatus which is capable of improving an inspection throughput by increasing a pixel size, while being small defects can be detected with a high accuracy.

To achieve the above objects, an electron beam apparatus according to the present invention comprises:

a plurality of electron guns for emitting a plurality of primary electron beams, each of the electron guns comprising a mechanism for adjusting a relative position between a cathode and anode.

In a preferred embodiment of the electron beam apparatus according to the present invention, the adjusting mechanism of each of the electron guns comprises:

an insulator supporting the cathode; and a plurality of piezo elements supporting the insulator, the piezo elements having lengths that vary depending on voltages which are applied thereto.

In a preferred embodiment of the electron beam apparatus according to present invention, each of the electron guns further comprises a metal member located near the cathode, for reflecting radiation generated from the cathode to a portion around the tip of the cathode. In this case, it is preferable that each of the electron guns further comprises a metal member located near the cathode, for reflecting radiation generated from the cathode to a portion around the tip of the cathode and preventing materials evaporating from the cathode and/or an Wehnelt from attaching to the insulator.

In a preferred embodiment of the electron beam apparatus according to the present invention, the cathode of the electron gun is a thermal electron emission gun, and the electron gun is adapted to emit an electron beam which provides brightness greater than the Langmuir limit.

The present invention further provides an electron beam apparatus for inspecting a sample, which comprises:

a plurality of electron guns for emitting a plurality of primary electron beams; and a plurality of lenses respectively corresponding to the electron guns, for converging the primary electron beams emitted from the electron guns, wherein the lenses comprises a plurality of laminated insulation plates each of which has throughholes at portions respectively corresponding to optical axes of the primary electron beams, and each of the laminated insulation plates has a plurality of lens electrodes made by dividing a metal coating layer on the insulation plate correspondingly to the throughholes therein.

The present invention further provides an electron beam apparatus for inspecting a sample, which comprises:

a plurality of electron guns for emitting a plurality of primary electron beams; and a plurality of electro-magnetic deflectors respectively corresponding to the electron guns, for deflecting secondary electron beams emitted from the sample, wherein each of the electro-magnetic deflectors comprises:

a pair of ferromagnetic materials located at opposing sides on a circle and having an arc shape; and a pair of permanent magnets located at opposing sides on the circle, the same poles of the respective permanent magnets facing each other to generate magnetic flexes in opposing directions.

The present invention still further provides an electron beam apparatus for inspecting a sample, which comprises:

a plurality of electron guns for emitting a plurality of primary electron beams;

a plurality of E×B separators respectively corresponding to the electron guns, for separating secondary electrons emitted from the sample from primary optical systems, wherein the E×B separators comprise:

a plurality of electrostatic deflectors comprising throughholes provided at potions of an insulation plate correspondingly to axes of the primary electron beams, and a plurality of electrodes in grooves which divide portions around the respective throughholes of the insulation plate; and a plurality of electromagnetic deflectors respectively located around the electrostatic deflectors.

The present invention further provides an electron beam apparatus for inspecting a sample, which comprises:

a plurality of electron guns for emitting a plurality of primary electron beams, the electron guns comprising:

a plurality of Wehnelt electrodes comprising a plurality of Wehnelt throughholes located at portions of an Wehnelt plate respectively corresponding to axes of the primary electron beams emitted from the electron guns, and thin portions around the respective Wehnelt throughholes of the Wehnelt plate;

a plurality of cathodes having the same axes as those of the respective Wehnelt throughholes; and a plurality of anodes comprising throughhoples in a plate, the throughholes having the same axes as those of the Wehnelt throughholes.

The present invention further provides an electron beam apparatus for detecting defects in a sample, which comprises:

a mechanism for setting a pixel size to be approximately equal to a minimum line width of the sample; and a mechanism for providing a Modulation Transfer Function (MTF) of a secondary electron detection signal at 0.55 or more when a line and space pattern having the minimum line width is scanned, thereby capable of detecting defects having a size about one-half of the pixel size or smaller.

The present invention further provides an electron beam apparatus for detecting defects in a sample, which comprises:

a mechanism for setting a pixel size to be approximately equal to a minimum line width; and a mechanism for providing a signal/noise ratio (S/N) of a secondary electron detection signal at 20 or more where the noise N is a 3σ value, thereby capable of detecting defects having about one-half of the pixel size or smaller.

In a preferred embodiment of an electron beam apparatus according to the present invention, the sample is a mask comprising a stencil or membrane mask, and the electron beam apparatus comprises:

an electron gun for emitting an electron beam;

an optical system for condensing the electron beam to irradiate the mask therewith;

an optical system for enlarging an electron beam which has been passed through the mask, to provide a transmission electron beam; and an imaging apparatus for capturing an image of the mask from the transmission electron beam.

The present invention further provides an electron beam apparatus comprises:

an electron gun for emitting an electron beam;

an optical system for condensing the electron beam to irradiate the sample therewith;

an optical system for enlarging an electron beam which has been passed through the sample, to provide a transmission electron beam;

an imaging apparatus for capturing an image of the sample from the transmission electron beam; and defect-detection circuit for detecting defects on the sample from the image by die-to-die comparison or cell-to-cell comparison.

The present invention further provides a method of setting an electron beam apparatus which comprises a plurality of electron guns, to detect a defect on a sample having a size equal to less than one-half of a pixel size, comprising the steps of:

setting the electron guns to operate in the space charge limiting region so that a shot noise reduction coefficient is equal to a predetermined value; and setting a Modulation Transfer Function (MTF) of a secondary electron detection signal at 0.55 or more when a line and space patter having a minimum line width is scanned, by focussing the beam size sufficiently small.

DETAILED DESCRIPTION OF THE INVENTION

Figures 1A, 1B:
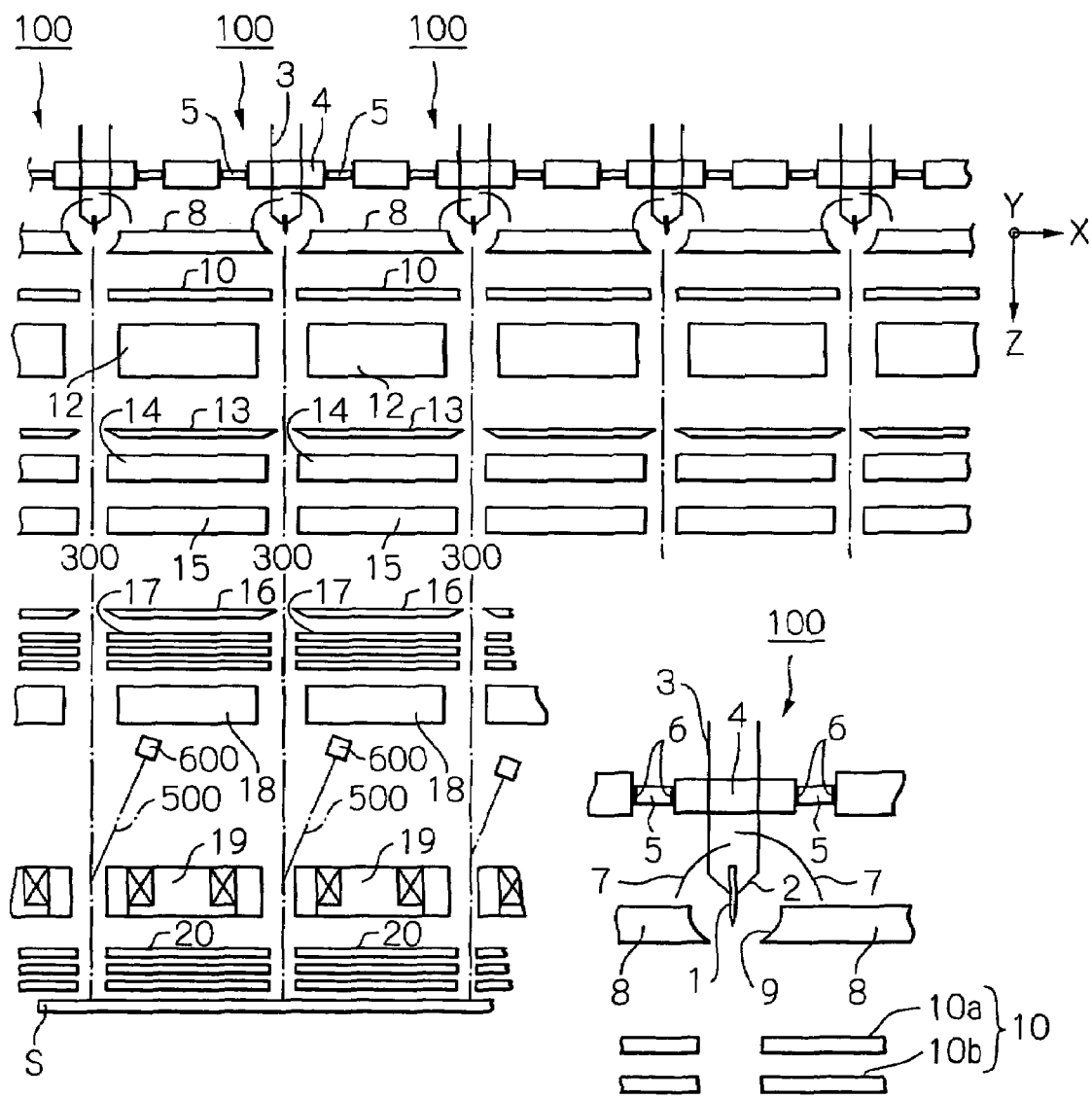
FIG. 1A is a schematic diagram illustrating one embodiment of an electron beam apparatus according to the present invention.
FIG. 1B is a cross-sectional view generally illustrating an electron gun which is applicable to the electron beam apparatus of FIG. 1A.

FIG. 1A schematically illustrates a main portion of an electron beam apparatus according to the present invention, and FIG. 1B is an enlarged cross-sectional view of an electron gun which is applicable to the electron beam apparatus. As illustrated in FIG. 1A, the electron beam apparatus comprises a predetermined number of electron guns 100, and the same number of primary optical systems 300 for irradiating a sample S such as a single wafer or mask with primary electron beams (or charged particle beams). The respective electron guns 100 are identical in structure and are arranged on an X-Y plane. The respective primary optical systems 300 are also identical in structure, and respectively have optical axes in a direction perpendicular to the X-Y plane.

As shown in FIG. 1B, the electron gun 100 has a cathode 1 of a thermal electron emission type made of LaB6, welded at the tip of a tungsten hairpin 2 which in turn is secured to a ceramic base 4 by a stem 3. The ceramic base 4 is supported by four piezo elements 5 at the center of a throughhole formed through a ceramic substrate P (see FIG. 2A) on the X-Y plane. Electrodes 6 are provided on opposing end faces of each piezo element 5.

A shield plate 7 is provided between the cathode 1 and ceramic base 4 for preventing the materials evaporated from the cathode 1 and tungsten hairpin 2 from being sputtered on the surface of the ceramic base 4 which would otherwise result in insulating properties of the base being degraded. The shield plate 7 is formed to be concave toward the cathode 1 so that radiations emitted from the cathode 1 and tungsten hairpin 2 are reflected toward the cathode 1. Similarly, a side surface 9 (opposing the cathode 1) of a Wehnelt plate 8 provided in the electron gun 100 is also formed to have a shape as to permit reflection of radiations emitted from the cathode 1 and tungsten hairpin 2 to the tip of the cathode 1, for example, concave toward the cathode 1.

In the embodiment shown in FIG. 1B, the electron gun 100 has an anode 10 which is composed of a first anode 10a and a second anode 10b. These anodes 10a, 10b are applied with voltages such that electron beams emitted from the cathode 1 form a cross-over in a shaping aperture 13 as a result of a convex lens action of these anodes 10a, 10b.

Figure 2A:
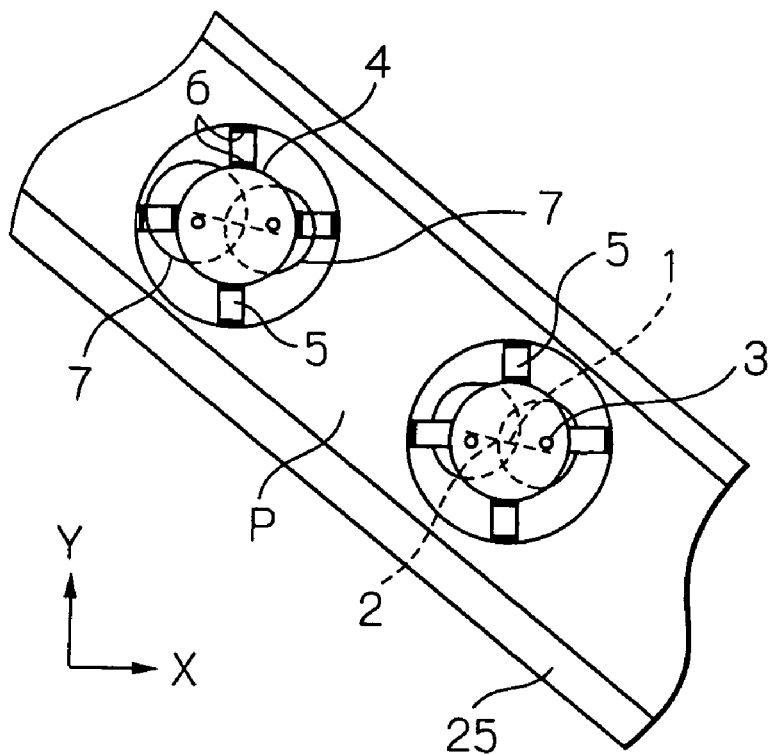
FIG. 2A is a plan view for explaining a structure and arrangement of a plurality of electron guns in the electron beam apparatus of FIG. 1A.

The tip of the cathode 1 is part of a sphere having a radius of curvature of 30 μm. When an electron gun current is set at a particular value, the cathode 1 can exhibit a brightness which is higher by one digit or more than the Langmuir limit ($1.4\times10^5$ A/cm$^2$sr at 4.5 kV). To provide such a high brightness, the cathode 1, Wehnelt plate 8 and anode 10 (anodes 10a and 10b) must be in exact alignment. To realize such an alignment, the ceramic base 4, on which the cathode 1 is secured, is supported by the four piezo elements 5 at the front, back, left and right, as illustrated in FIG. 2A, and an alignment deflector 12 is disposed between the second anode 10b and shaping aperture 13, as illustrated in FIG. 1A.

To the first anode 10 there may be applied a wobble voltage (or periodically varying voltage). In this event, part of electron beams passing through the shaping aperture 13, which is absorbed by an NA aperture 16, is detected as a current. The alignment deflector 12 two-dimensionally scans the electron beams to display an image of the shaping aperture 13 on a display such as a cathode ray tube (not shown), and to the first anode 10a there is applied the wobble voltage. In this event, the respective piezo elements 5 are applied with voltages from the associated electrodes 6 such that the image of the shaping aperture 13 does not move in an X- or Y-direction. This can be realized by applying one of each set of opposing piezo elements 5 with a voltage for expanding and the other piezo element 5 with a voltage for contracting, to finely change the position of the ceramic base 4, and by adjusting the voltages such that the image of the shaping aperture 13 does not move upon application of the wobble voltage. Further, by appropriately selecting voltages applied to the first anode 10a and second anode 10b, as well as the electron gun current, a resulting brightness significantly exceeds the Langmuir limit when the optical axes of respective components of the primary optical system 300 exactly match. These operations may be automatically controlled by a computer which controls the voltages applied to the electrodes in response to the current absorbed by the NA aperture 16.

An electron beam shaped by the shaping aperture 13 is scaled down by a condenser lens 17 and objective lens 20, each of which has three electrodes, and forms a probe of approximately 50 nm on the sample S. As the electron beam is two-dimensionally scanned on the sample S using a scanning deflector 18 and E×B separator 19, secondary electrons are emitted from the sample S. The secondary electrons are separated from the primary electron beam by the E×B separator 19, and detected by a secondary electron detector 600 through a secondary optical system 500. The secondary electron detector 600 is provided in a transversal direction of the ceramic substrate P so as to enable the detection of secondary electrons, even if the E×B separator 19 provides a minimum amount of deflection. Since the secondary optical system 500 and secondary electron detector 600 are comprised of known components, detailed description thereof is omitted.

An electric signal generated by the secondary electron detector 600 is processed by an image forming or processing circuit (not shown) to generate a SEM image. The resulting image can be compared with a reference image in a defect detecting circuit (not shown), or a plurality of obtained images can be compared with one another for corresponding locations of different chips or different cells of the same chip, thereby detecting defects on the sample S.

It should be noted that the NA aperture 16 can be made to be in alignment with the reducing lens 17 by associating alignment deflectors 14, 15 in the primary optical system 300. Alternatively, the scanning deflector 18 disposed between the reducing lens 17 and E×B separator 19 may be provided with an alignment function. The E×B separator 19 is preferably connected to a power supply for astigmatism correction, in addition to a DC power supply for its operation.

Figure 2B:
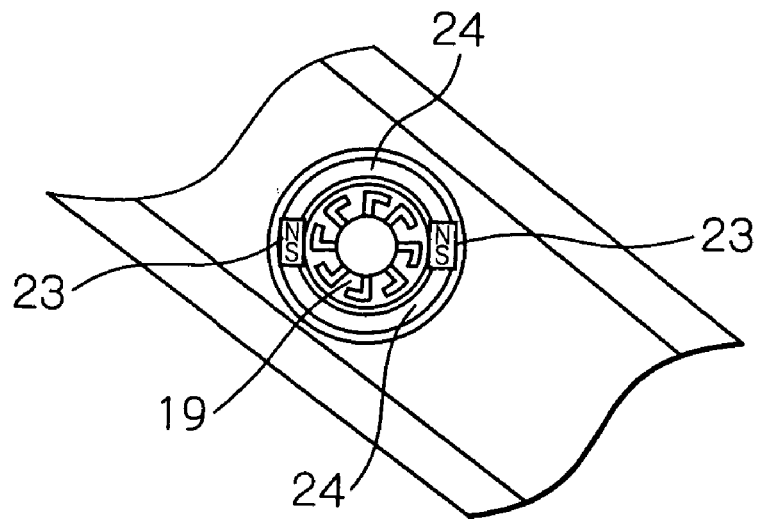
FIG. 2B is a plan view illustrating one of E×B separators in the electron beam apparatus of FIG. 1A.

The electron beam apparatus illustrated in FIG. 1A includes permanent magnets 23 requiring no wiring, at opposing locations as shown in FIG. 2B, which are coupled by a pair of half rings 24 to form a magnetic circuit. The rings 24 may be made of a high magnetic-permeable material such as a ferromagnetic material such as a soft magnetic iron, ferrite, permalloy, permendur, suppermalloy and/or mu-metal.

The sample S is preferably applied with a negative voltage to reduce spherical aberration and axial chromatic aberration of the objective lens 20.

The electron guns 10 and primary optical systems 300 illustrated in FIGS. 1A and 1B are assembled in the following manner.

(1) Several ceramic substrate which have a required length and required thicknesses are prepared, for instance one for the cathode, one for the Wehnelt, two for the anodes, three for the alignment deflectors, two for the apertures, six for the lenses, and two for the scanning deflectors.

(2) Each of these ceramic substrates is formed to have a number of circular holes corresponding to a number of electron guns at corresponding positions.

(3) Each of the ceramic substrates is processed to match the optical axes (or holes), and the processed ceramic substrates are laid at their respective predetermined locations.

(4) Requisite metal coatings are applied to requisite regions of the ceramic substrates.

(5) Finally, the ceramic substrates are assembled with high accuracy using knock pins.

To prevent the elongated ceramic substrates from distorting, the ceramic substrates may be provided with a rib structure 25 (see FIG. 2A) on one side surface thereof in a longitudinal direction, as required, to increase thickness.

In actuality, as illustrated in FIG. 2A, each electron gun has a pair of the opposing piezo elements disposed on the X-axis, a remaining pair of the piezo elements disposed on the Y-axis, and the ceramic substrate P disposed such that the major axis thereof is at 45 degrees to the X- and Y-axes. A pair of the piezo actuator can be changed to two springs. As a result, the primary optical systems 300 are spaced apart from each other in the X-axis direction by the distance between the optical axes of adjoining primary optical systems 300 multiplied by $1/\sqrt{2}$. Therefore, by adjusting the ceramic substrate P within 45 degrees, the distance between the optical axes of the adjoining primary optical systems 300 in the X-axis direction can be matched with chips on the surface of the sample S. For example, when 20 optical systems are arranged on a 15-inch wafer, the resulting throughput can be improved to approximately 15 times greater.

Referring next to FIGS. 3 to 6, detailed description will be made on an arrangement of a plurality of electron guns 100, and a structure of each electron gun 100 which is applicable to the electron beam apparatus illustrated in FIG. 1A.

Figure 3:
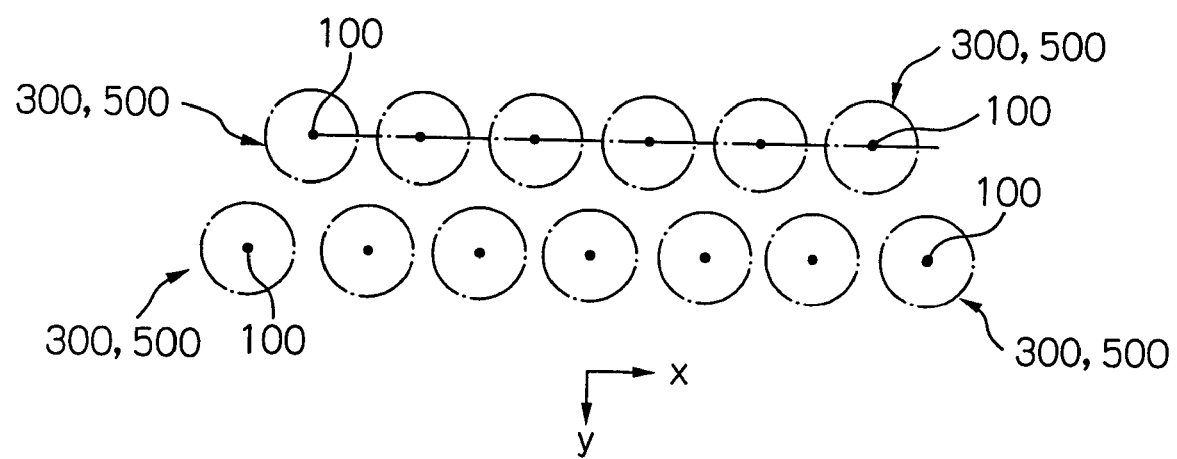
FIG. 3 is an explanatory diagram for explaining another arrangement pattern of units each including an electron gun, primary and secondary optical systems and a detector in the electron beam apparatus of FIG. 1A.
Figure 4:
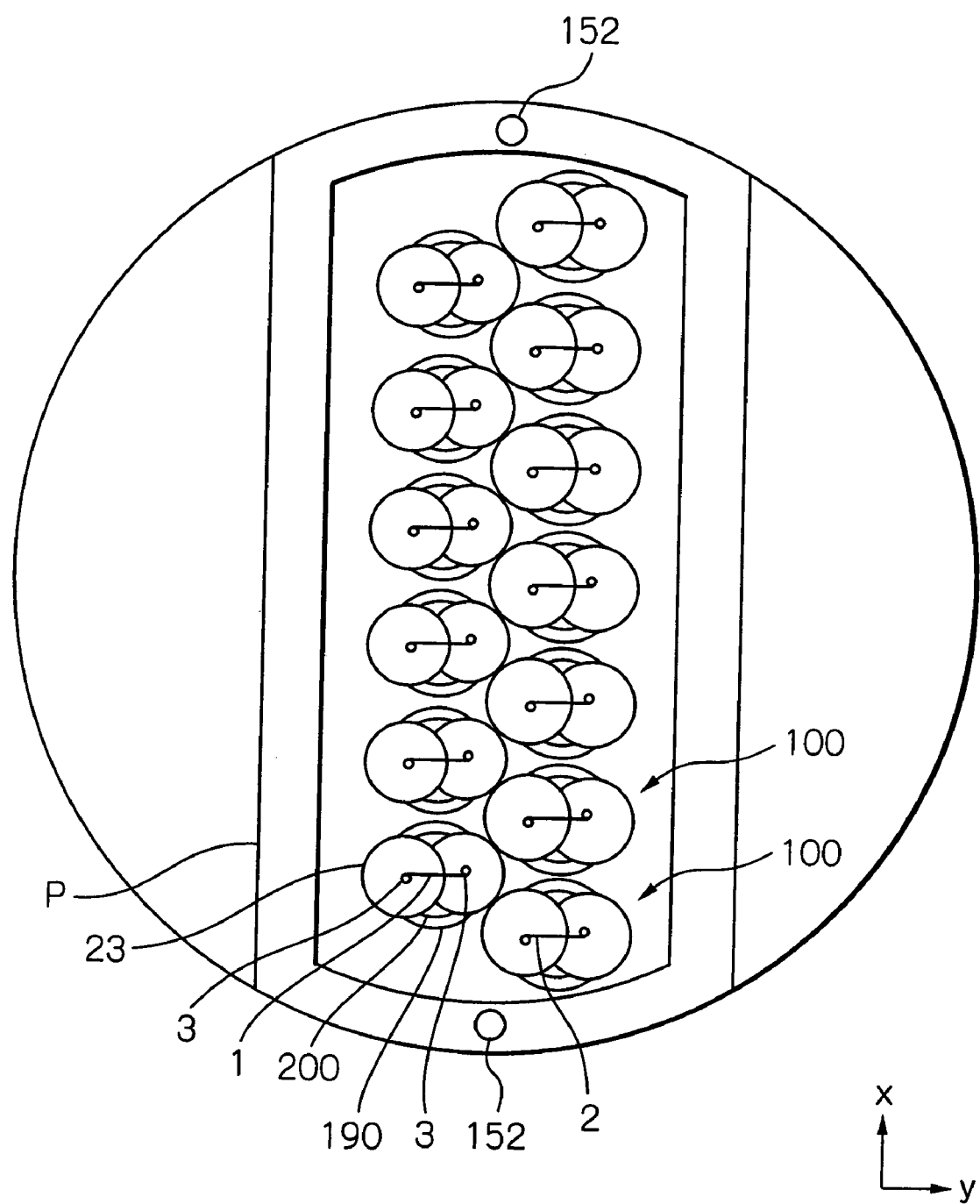
FIG. 4 is a plan view of a plurality of electron guns arranged in the pattern illustrated in FIG. 3.

FIG. 3 schematically illustrates a plurality (13 in this example) of electron guns and the like arranged two-dimensionally in the electron beam apparatus illustrated in FIG. 1A. While the electron guns are arranged in one column in the pattern described in connection with FIG. 2, the electron guns are arranged in two columns in the X-direction in the illustrated example, such that if their optical axes are projected on the X-axis, they are spaced at approximately equal intervals. It should be understood that the electron guns can also be arranged in a plurality of columns, not limited to two columns. FIG. 4 is a plan view illustrating the layout of a plurality of electron guns 100 when the optical axes are arranged as shown in FIG. 3.

Figure 5:
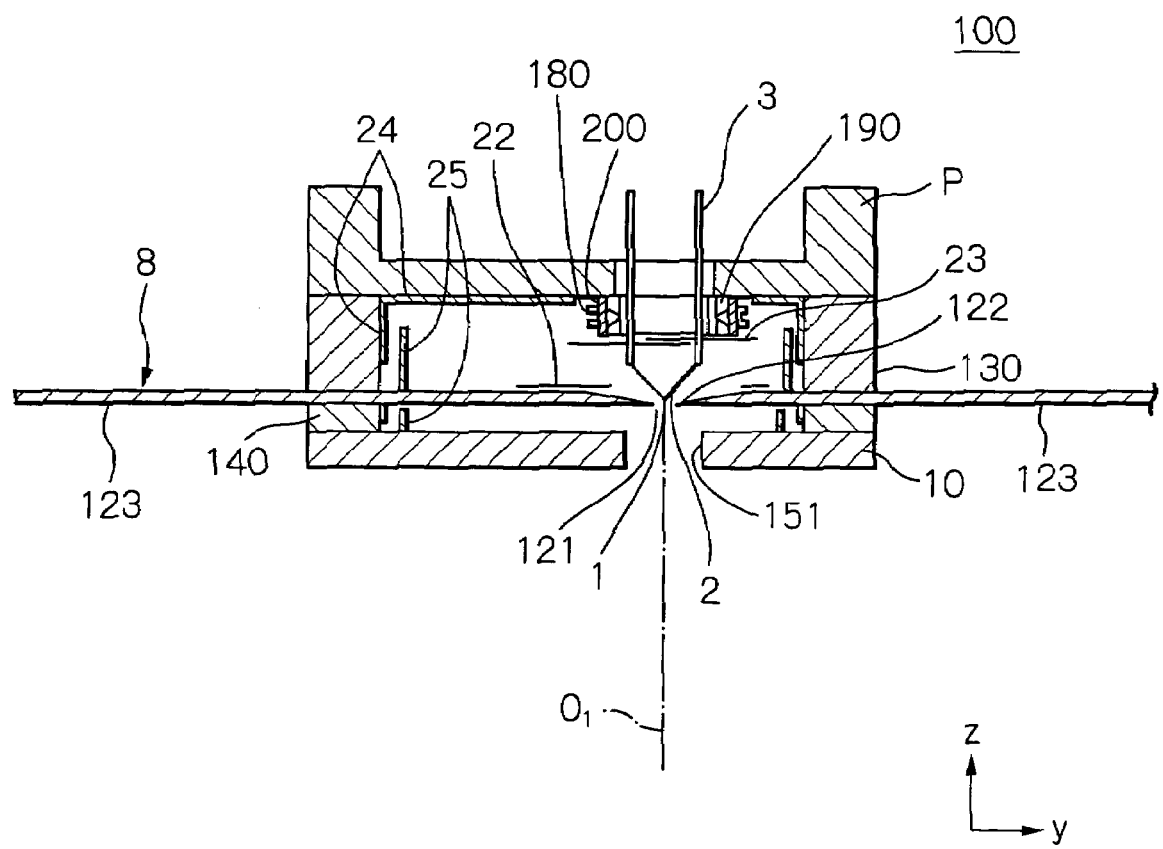
FIG. 5 is a cross-sectional view generally illustrating an electron gun which is applicable to the electron beam apparatus of FIG. 1A.

FIG. 5 illustrates a cross-sectional view of each electron gun 100 which comprises a thermal electron emission (LaB6) cathode 1; a Wehnelt plate 8; insulation spacers 130, 140; and an anode 10, as can be seen in FIG. 5. In this embodiment, the anode 10 is made of a single ceramic plate. The cathode 1 is welded to a tungsten filament (tungsten hairpin) 2 which in turn is welded to a stem 3. The stem 3 is attached to a single ceramic substrate P which supports a plurality of electron guns 100. The Wehnelt plate 8 has a circular Wehnelt hole 121 formed at a position corresponding to the optical axis O1, which also serves as the center axis of the cathode 1 in each electron gun 100; a thin region 122 formed around the Wehnelt hole 121 and concentric with the Wehnelt hole 121; and a thick region 123 extending outward from the thin region 122 and having a larger thickness than the thin region 122. The Wehnelt hole 121 and thin region 122 comprise a Wehnelt electrode of the electron gun 100.

The cathode 1 can be adjusted with an adjusting screw 180 so that its position in the X-Y direction exactly matches the center of the Wehnelt hole 121 (i.e., the optical axis O1). The adjusting screw 180 is attached to beams or ribbed plates 190, 200.

Since the cathode 1 may vary in its position in the Z-direction when it is welded, a bias voltage applied to each Wehnelt electrode must be independently adjusted to tune a cathode current or brightness. For this purpose, as illustrated in FIG. 5, the Wehnelt plate 8 has a thin region 122 which is processed to match the X-Y coordinates of the cathode 1. In addition, there are applied to surfaces of the Wehnelt plate 8 of ceramic, i.e., the top surface and bottom surface, as well as the inner surface of the Wehnelt hole 121, metal coatings.

Figure 6:
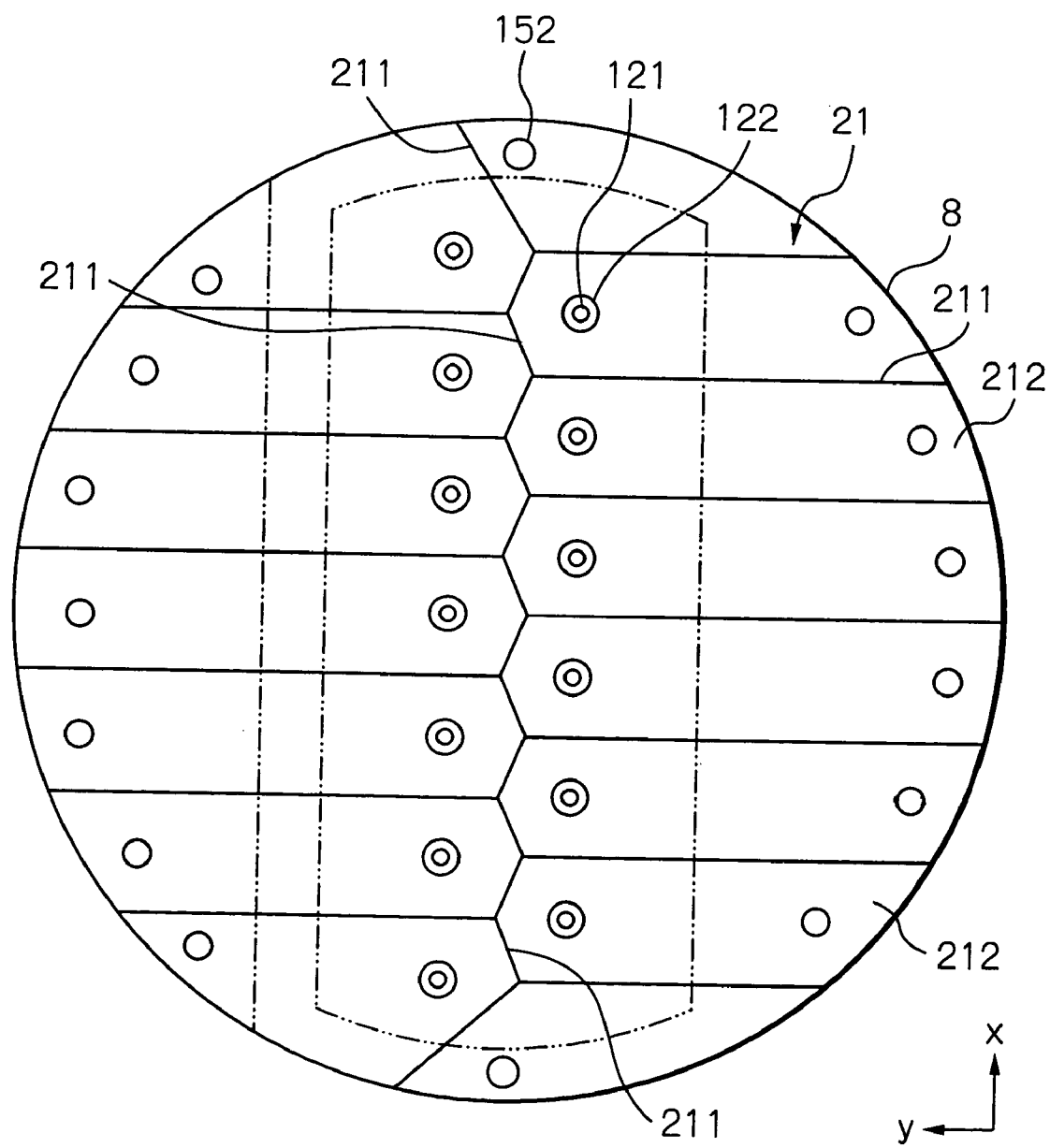
FIG. 6 is a plan view of a plurality of Wehnelts arranged in the pattern illustrated in FIG. 4.

Subsequently, the metal coating layers applied to the top surface and bottom surface of the Wehnelt plate 8 are selectively removed in accordance with a pattern 21 of parting lines 211 shown in FIG. 6. Specifically, these metal coating layers are divided into a plurality of areas by the parting lines 211, and the areas are electrically insulated from the other areas. The coating layer in each area comprises a conductor 212 through which each Wehnelt electrode is connected to an associated external power supply (not shown). Thus, the bias voltages applied to the respective Wehnelt electrodes can be adjusted independently by voltages applied to the conductors 212 formed on the Wehnelt plate 8.

To shield the parting lines 211 or insulation regions on the Wehnelt plate 8 from a primary electron beam, a portion of the thin region 122 bordered with the cathode 1 is provided with shield plates 22, each on the front side and on the back side, which are at the same potential as the Wehnelt electrode. The Wehnelt electrode of the Wehnelt plate 8, and the shield plate 22 comprise the Wehnelt of the electron gun. In addition, a metal disk 23 is welded to each stem 3 (see FIG. 5) to shield the insulation region from the primary electron beam. Moreover, a metallization 24 and a shield plate 25 are provided to shield the insulation spacers 130, 140 from the primary electron beam.

The anodes 10 are formed with a plurality of holes 151 concentric with the Wehnelt holes 121, at locations corresponding to associated cathodes 1. The anode 10 is disposed below the Wehnelt plate 8 through the insulation spacer 140 using the knock pin 152.

Figure 7A:
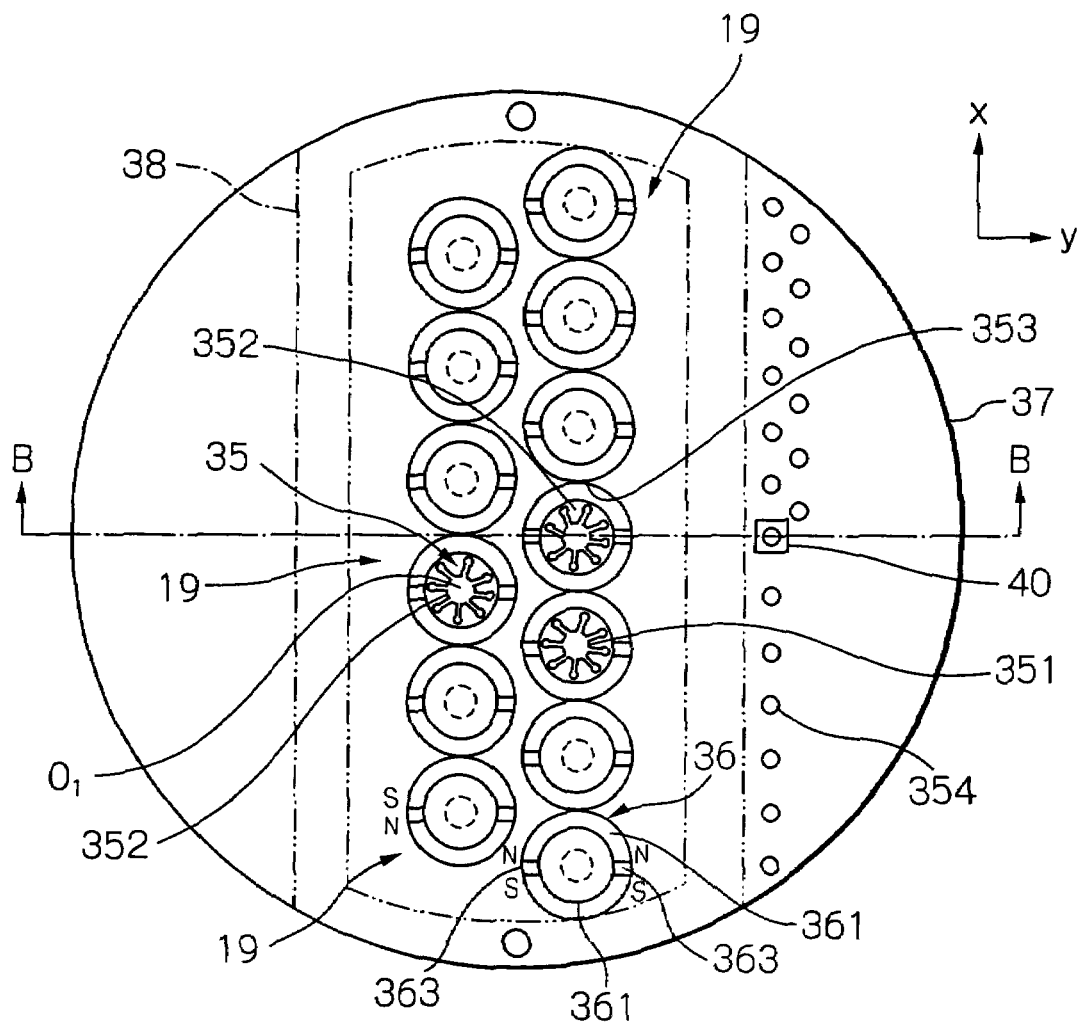
FIG. 7A is a plan view of a plurality of E×B separators arranged in the pattern illustrated in FIG. 4.
Figure 7B:
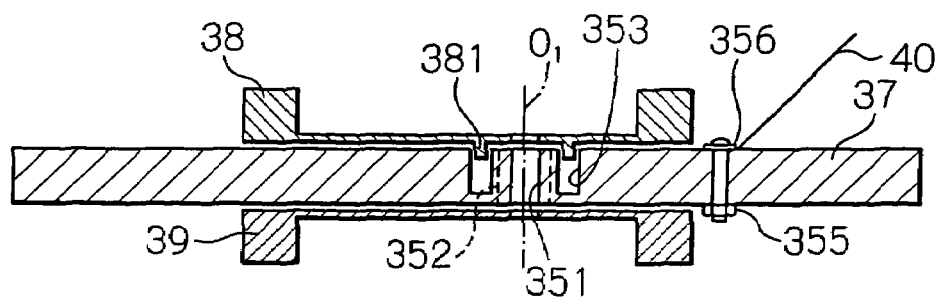
FIG. 7B is a enlarged cross-sectional view taken along a line B-B in FIG. 7A.
Figure 8:
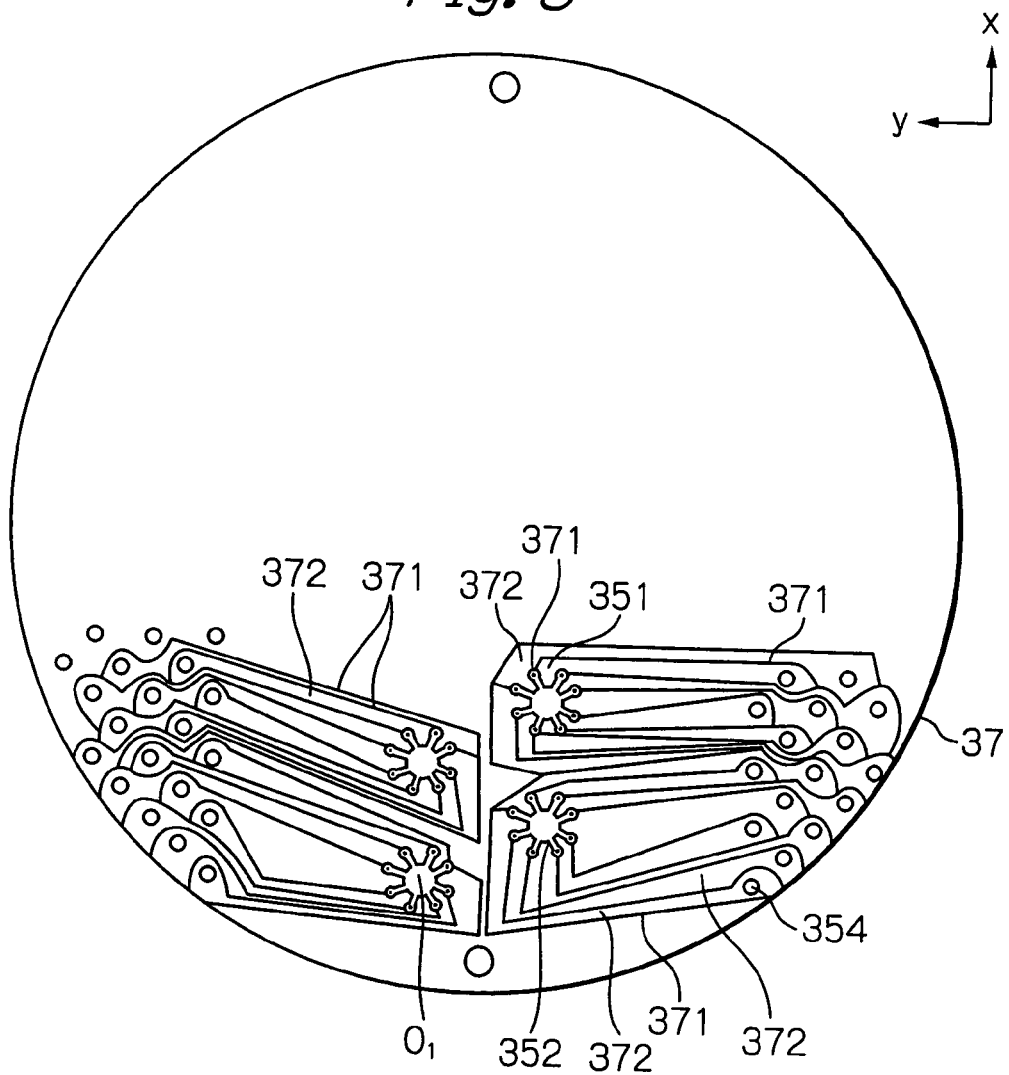
FIG. 8 is a diagram showing how lead wires are drawn out from the plurality of E×B separator electrodes illustrated in FIG. 7A.

FIG. 7A is a plan view illustrating an arrangement of a plurality of ExB separators when the optical axes are defined as shown in FIG. 3. FIG. 7B is a cross-sectional view of one ExB separator 19, viewed along a line B-B in FIG. 7A. FIG. 8 is a bottom view of the ExB separator 19, when viewed from below, showing only part thereof. As illustrated in FIG. 7A, the ExB separators 19 are arranged in two columns along the X-direction in a staggered format to make up a single ExB separator group as a whole. Each ExB separator 19 is disposed at a location corresponding to one optical axis O1 of the electron gun associated therewith. Each ExB separator 19 comprises a multi-electrode (for example, 8-electrode in this embodiment) electrostatic deflector 35, and an electromagnetic deflector 36 provided around the electrostatic deflector 35.

The electrostatic deflector 35 comprises an insulating substrate 37 made of an insulation material such as machinable ceramic; an inner cylinder 351 provided at a location corresponding to each optical axis; and separation grooves 352 for radially separating the inner wall of the inner cylinder 351, for example, into eight. Eight electrodes are formed on the inner wall of the inner cylinder 351 by the separation grooves 352. An annular groove 353 is also formed around the electrostatic deflector 35. The insulating substrate 37 is applied with coating layers composed of nickel, phosphor and gold on the bottom surface, the inner surface of the inner cylinder 351, and on the inner surfaces of the separation grooves 352. Subsequently, the coating layer is etched by lithography to form parting lines 371 on the inner surfaces of the separation grooves 352 and on the bottom surface of the insulating substrate 37. Another process is as follows: A resist is coated over a surface of a ceramic plate, a resist pattern is formed by lithography, a metal coating is formed on the no coating surface, and the resist is removed.

The parting lines 371, which are formed on the coating layer on the bottom surface of the insulating substrate 37, extend from the radially outermost part of the inner surface of each separation groove 352 in accordance with a pattern illustrated in FIG. 8. In this way, the coating layer is divided into a plurality of areas which are electrically insulated from one another by the parting lines 371. The areas form conductors 372 connecting between the respective electrodes of the inner cylinder 351 and associated lead wire insert holes 354. On the top surface, only the inside of the annular groove 353 can be separated, where a connection can be made to a lead wire only from the bottom surface.

The electromagnetic deflector 36 comprises a magnetic circuit including two ferromagnetic members 361 made of soft magnetic iron, ferrite, permalloy, permendur, suppermalloy, mu-metal in the shape of arc, inserted into the annular groove 353, and two permanent magnets 363 likewise inserted into the annular groove 353. The two permanent magnets 363 are placed such that the N-poles and S-poles thereof oppose each other at the respective ends of the highly magnetic-permeable members 361, so that the magnetic fluxes of the two magnets repel each other to form a magnetic field oriented in the Y-direction on the optical axis O1.

For shielding the insulating surface of the insulating substrate from electron beams, shield plates 38, 39 are provided above and below each ExB separator 19. The upper shield plate 38 is also provided with a stopper 381 for preventing the electromagnetic deflector 36 from moving up and down in the Z-direction.

A connection of a lead wire 40 to the lead wire insert hole 354 may be made by fixing a crimp terminal 356 in the lead wire insert hole 354 with a screw and a nut 355, and crimping the lead wire 40 to the crimp terminal 356, resulting in a particle free connection without soldering.

Figure 9:
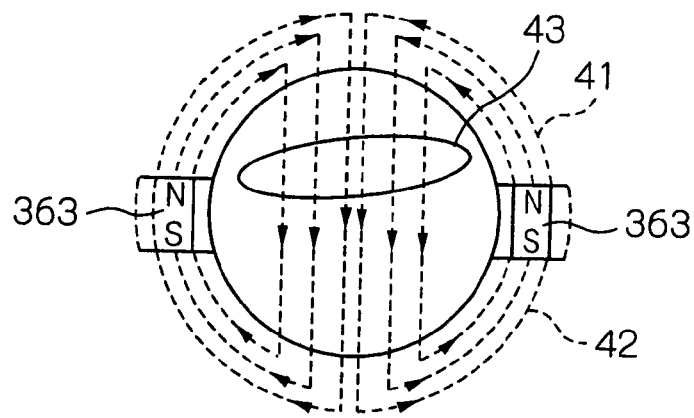
FIG. 9 is an explanatory diagram conceptually showing the generation of magnetic flux by an electromagnetic deflector using two permanent magnets.

FIG. 9 illustrates the concept of the formation of the magnetic fluxes in the electromagnetic deflector which uses the two permanent magnets 363. In FIG. 9, magnetic circuits 41, 42 are made of soft magnetic iron, ferrite, permalloy, permendur, suppermalloy or mu-metal, and magnetic flux generated thereby are generally designated by reference numeral 43.

Figure 10A:
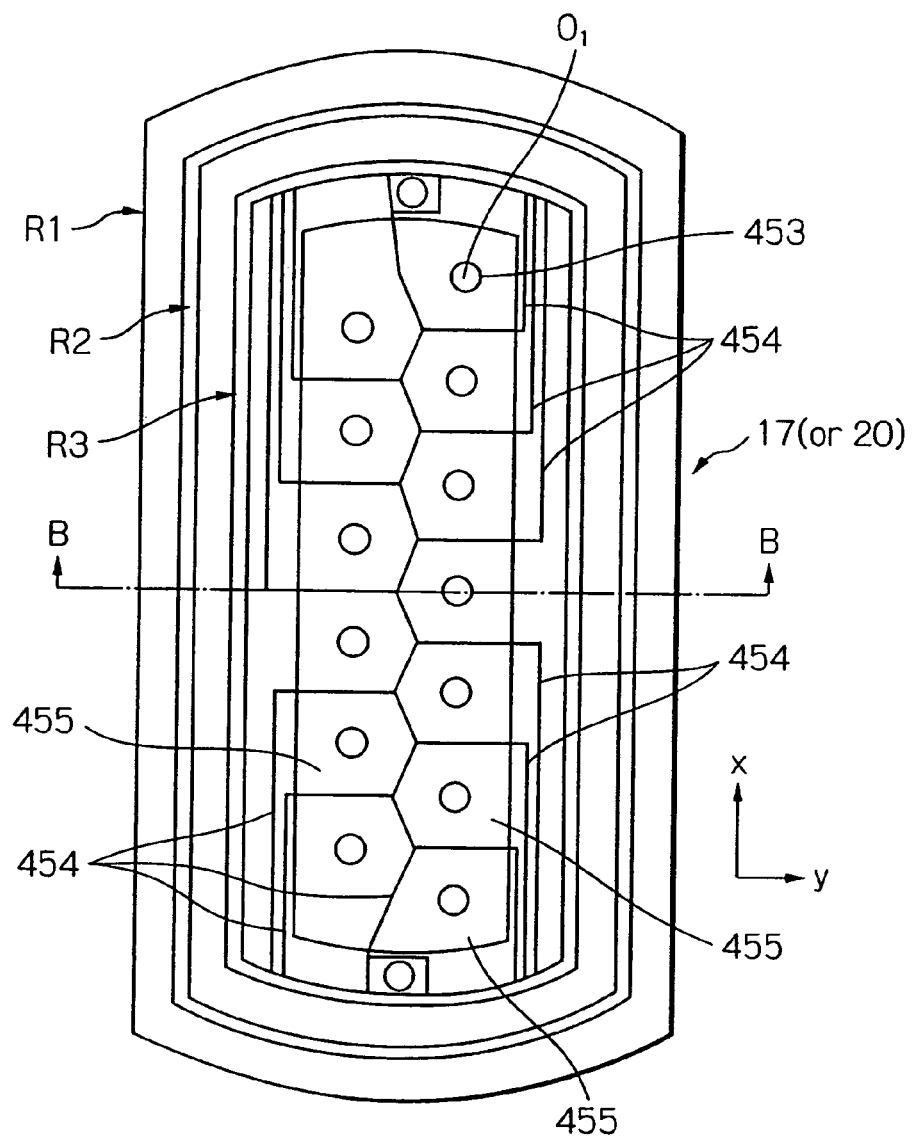
FIG. 10A is a plan view of a lens from which some parts are removed for showing a structure thereof.
Figure 10B:
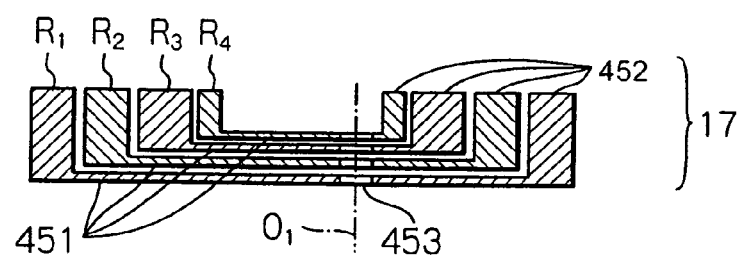
FIG. 10B is a cross-sectional view taken along a line B-B in FIG. 10A.

FIG. 10A is a plan view of the condenser lens 17, a portion thereof being removed, when a plurality of optical axes are defined as illustrated in FIG. 3, and FIG. 10B is a cross-sectional view of the condenser lens 17 taken along a line B-B in FIG. 10A. Since the objective lens 20 is substantially identical in structure to the condenser lens 17, the condenser lens 17 will be taken as representative and described in detail.

The condenser lens 17 comprises four lens electrodes R1-R4. Each of the lens electrodes R1-R4 has a thin plate section 451 and a beam structure section or thick plate section 452, made of an insulation material, as well as a concentric hole 453 formed at a location corresponding to the optical axis O1 of an associated electron gun. In FIG. 10B, the two lens electrodes R1, R2 seen from below in the Z-direction (i.e., in the direction of the optical axis O1) are entirely covered with metal coating layers, and have a voltage applied that is common to all the primary optical systems. More specifically, the lens electrode R1 is applied with metal coating layers on the inner surface of the hole 453, the top surface and bottom surface of the thin plate section 451, and the inner side surfaces, top surface and bottom surface of the beam structure section 452. The lens electrode R2 is also applied with coating layers in a similar manner. Therefore, the lens electrodes R1, R2 can be connected to lead wires (not shown) at arbitrary locations in peripheral regions thereof.

Though the third lens electrode R3 seen from below in the Z-direction is essentially a ground electrode, it is separated such that the focal distance can be finely adjusted for each primary optical system. FIG. 10A is a view of the condenser lens 17, from which the fourth lens electrode R4 seen from below in the Z-direction is removed, to show a pattern 450 for separating the lens electrode R3, indicated by thin lines 454. The thin lines 454 represent insulation sections where the metal coating is removed. The insulation sections are actually formed to be of a certain width for blocking electric conduction between the conductors formed by adjoining coating layers. The lens electrode R3 is applied with metal coatings on the inner surface of the hole 453, the top surface and bottom surface of the thin plate section 451, and the inner side surfaces, top surface and bottom surface of the beam structure section 452. The metal coating layer is parted in accordance with a pattern indicated by the thin lines 454 into a plurality of areas. The areas are electrically insulated from areas adjacent from one another. The coating layer in each area comprises a conductor 455 through which the lens electrode R3 is connected to a lead wire (not shown) of an external power supply. In this way, the focal distance can be finely adjusted for each primary optical system by controlling a voltage from the power supply.

An insulation section (not shown), having a pattern slightly simpler than that of the insulation section in FIG. 10A, is also formed on the bottom surface of the lens electrode R3, i.e., the bottom surface of the thin plate section 451 and the bottom surface of the beam structure section 452. The pattern of the insulation section is slightly simplified because no lead-out terminal is provided on the bottom surface of the lens electrode R3, though the electrode on the bottom surface must be likewise insulated.

The lens electrode R4 is provided to shield the insulation sections formed on the top surface of the lens electrode R3 from electron beams. On the other hand, no extra shield electrode is required for the insulation section on the bottom surface of the lens electrode R3, because it is shielded by the lens electrode R2. However, if there is a large gap between the lens electrodes R2, R3, the lens electrode R4 may be provided for finely adjusting the focus, and an additional shield electrode may be provided above the lens electrode R4.

In the following, description will be made of the operation of the electron beam apparatus illustrated in FIG. 1A, which is equipped with the electron guns 100 and the primary optical systems 300, each of which comprises the condenser lens 17, E×B separator 19 and objective lens 20, described in connection with FIGS. 3-10.

Primary electron beams emitted from the cathodes 1 of the electron guns 100 are accelerated by the anodes 10. In this event, since each of the Wehnelt electrodes 8 can be applied with an independent voltage, the brightness of each electron beam can be adjusted independently even if there are variations in the distance between the cathode 1 and Wehnelt electrode 8. The primary electron beams are reshaped into narrow electron beams by the condenser lenses 17 and objective lenses 20, and scanned on a sample S. Therefore, the sample is simultaneously irradiated with the primary electron beams. Since the focal distance of the lens can be adjusted independently for each primary optical system 300, the intensity of the electron beam can be adjusted independently for each primary optical system 300 even when the single sample S is irradiated with a multiplicity of electron beams. Secondary electrons emitted from the sample S by the irradiation of the primary electron beams pass through the objective lens 20, separated from the primary optical system 300 by the E×B separator 19, introduced into the secondary optical system 500, and eventually detected by the secondary electron detector 600.

An improvement of a throughput of an inspection will next be explained. When the secondary electron detector 600 is implemented, for example, by a combination of a scintillator and PMT, an inspection throughput is degraded because the clock frequency for the scanning must be reduced to 100 MHz or lower. The following description will be focused on one embodiment of the electron beam apparatus according to the present invention for solving such a problem.

Figure 11A:
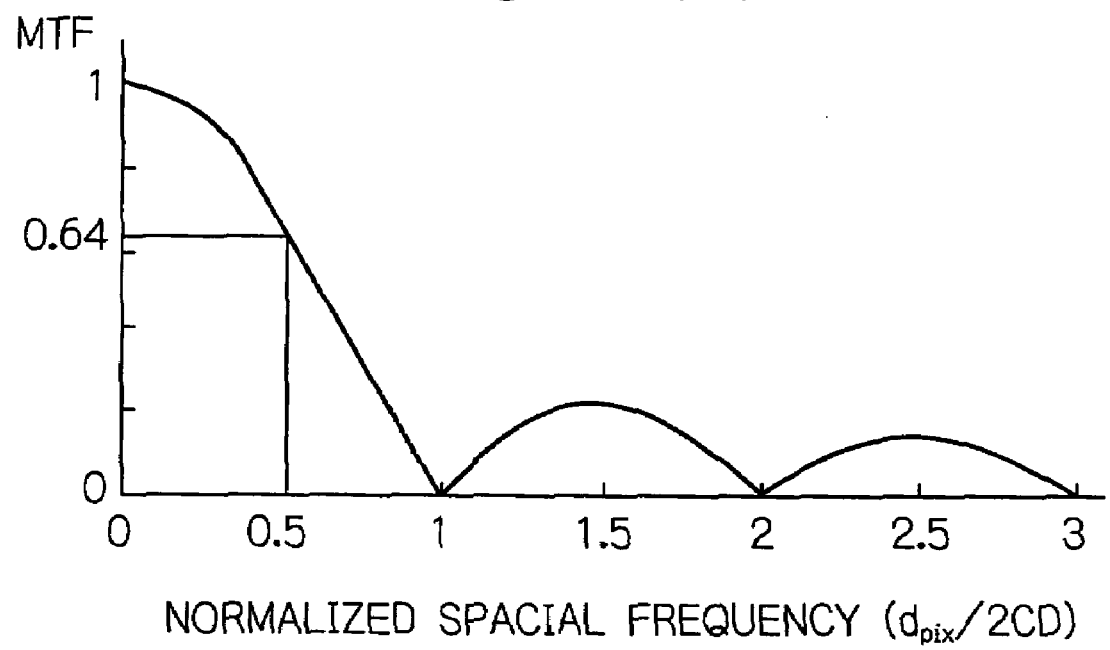
FIGS. 11A and 11B are graphs for explaining the basic principles of an electron beam apparatus according to the present invention which can improve an inspection throughput by increasing a size or dimension of pixels, while being capable of detection of even small defects with high accuracy.
Figure 11B:
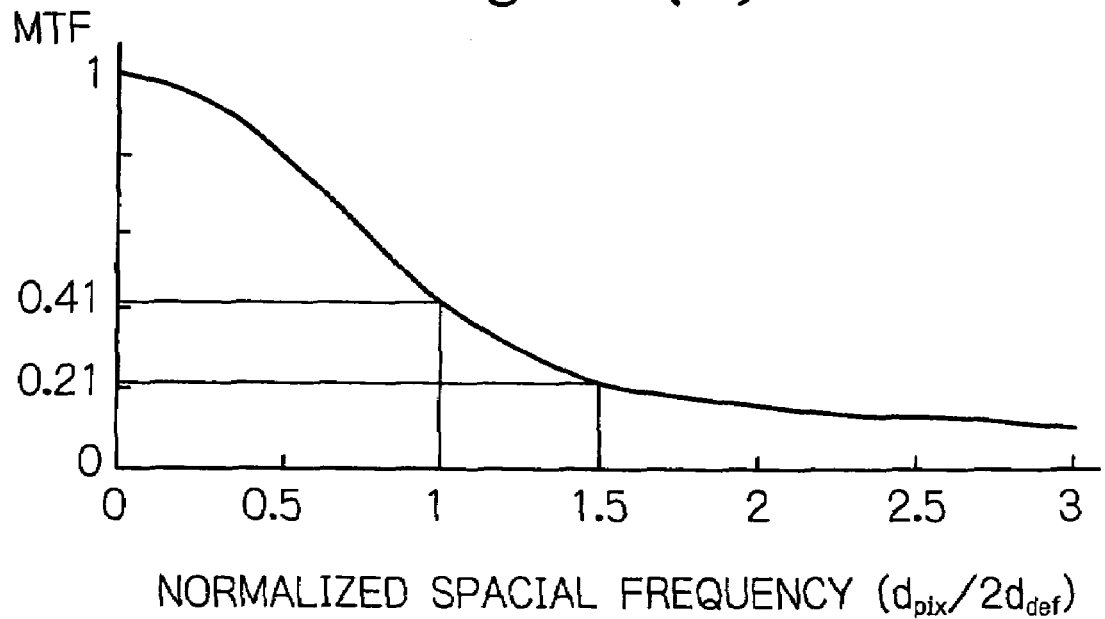

FIGS. 11A and 11B show graphs for explaining the basic principles (points of view) in the electron beam apparatus of the present invention. Specifically, FIG. 11A shows a graph representing the relationship between MTF (Modulation Transfer Function) produced when a periodic pattern is scanned and a normalized spatial frequency $d_{pix}/(2CD)$, while FIG. 11B shows a graph representing the relationship between the MTF which is a signal amplitude when a single defective structure is observed and a normalized spatial frequency $d_{pix}/(2d_{def})$, where $d_{pix}$ is a pixel size, CD is a minimum line width of the periodic pattern, and $d_{def}$ is a defect size. Further, MTF=MTF(pixel) which represents a signal transfer function due to the pixel size which is finite.

As shown in the graph of FIG. 11A, when the pixel size $d_{pix}$ is set twice the minimum line width DC for a periodic structure (i.e., $d_{pix}/2(CD)=1$), the resulting MTF or signal amplitude will be zero. However, when the pixel size $d_{pix}$ is set equal to the minimum line width DC (i.e., $d_{pix}/(2CD)=0.5$), the resulting MTF is equal to 0.64 (MTF=0.64). It can therefore be understood that relatively large MTF can be ensured even if the pixel size $d_{pix}$ is set substantially equal to the minimum line width CD.

However, when the pixel size $d_{pix}$ is set to $2d_{def}$ ($d_{pix}=2d_{def}$) for a single defective structure, since $d_{pix}$ divided by $2d_{def}$ is equal to one ($d_{pix}/2d_{def}=1$) for a defect having the size $d_{def}$ equal to one-half of CD, the resulting MTF is equal to 0.41, as can be seen in the graph of FIG. 11B. For a defect having the size $d_{def}$ equal to ⅓×CD, the resulting MTF is equal to 0.21.

As is apparent from the foregoing, a periodic pattern can be detected without any trouble even if the pixel size $d_{pix}$ is set substantially equal to the minimum line width CD of the periodic pattern, whereas the defect detecting accuracy will be degraded for smaller defects on the pattern.

The values of MTF in the graphs of FIGS. 11A and 11B are calculated on the assumption that the pixel size is finite (namely, MTF=MTF(pixel)). On the other hand, there is another MTF which is calculated on the assumption that the electron-optical system has a finite resolution. Here, this MTF is represented by MTF(E0). Then, as described in Ohnishi "Solid-State Image Sensing Device" published in (1982), the total MTF can be represented by:

MTF(total)=MTF(pixel)·MTF(E0)

From the foregoing, it will be appreciated that when MTF(E0) associated with the resolution of the optical system is increased for compensating MTF(pixel) for degradation caused by increasing the pixel size $d_{pix}$ equal to the minimum line width CD, large MTF(total) can be maintained to permit accurate detection of defects.

Bearing the foregoing in mind, description will be next made on how MTF(E0) should be set for compensating MTF(pixel) for the degradation.

Figure 12:
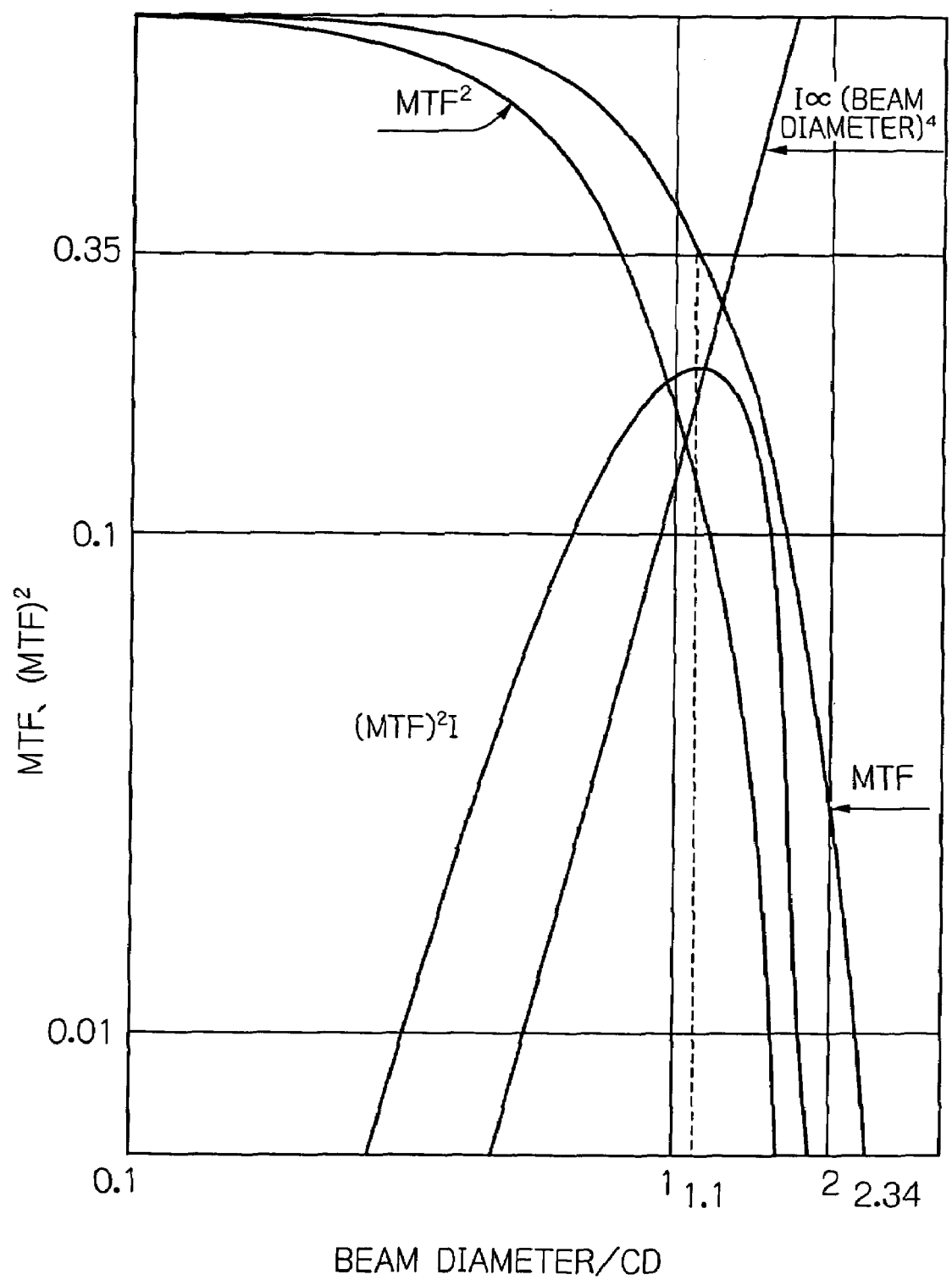
FIG. 12 is a graph showing relationships between MTF, $MTF^2$, beam current I and $(MTF)^2I$, and a beam diameter divided by a minimum line width CD.

FIG. 12 shows graphs representing the relationships between MTF, $(MTF)^2$, beam current I, and $(MTF)^2 I$ and beam diameter divided by CD. It should be noted that the beam diameter divided by CD is expressed on X axis as it's logarithm value, and that MTF in FIG. 12 refers to MTF (E0). When axial chromatic aberration is predominant in aberration of a lens, a change in beam diameter causes a change in the beam current I in proportion of fourth power of the beam diameter (i.e., $I \propto (\text{beam diameter})^4$). On the other hand, for scanning a line-and-space pattern, a larger beam diameter results in a smaller signal amplitude or MTF (=MTF(E0), as shown in the graph of MTF in FIG. 12. It can be understood from the foregoing relationships that a larger beam diameter results in a larger beam current but with a smaller signal amplitude, and conversely a smaller beam diameter results in a smaller beam current but with a signal amplitude of the magnitude identical to that generated when a pattern of large dimensions is scanned. It can be understood from the foregoing that there should be an optimal value for the beam diameter.

For finding the optimal value for the beam diameter, for example, in order to compensate the MTF reduced to one half, the signal amplitude must be increased by a factor of four, and therefore, the optimal value is found when $(MTF)^2 \cdot I$ presents a maximum value on the graph. Accordingly, the value of MTF is equal to 0.35 when $(MTF)^2 \cdot I$ is maximum, as shown in the graph of FIG. 12. This is the optimal value for MTF. For example, the beam diameter divided by CD in this event is approximately equal to 1.1. Therefore, MTF (E0)=0.35 can be obtained by setting the beam diameter to satisfy the condition for the beam diameter/CD approximately equal to 1.1.

With MTF=0.35, in the example described in connection with FIG. 11:

0.35×(0.64/0.41)=0.55 for $d_{pix}$=CD, and a defect having $d_{def}$=CD/2, so that MTF (pixel) degraded from 0.64 to 0.41 can be compensated for the degradation when MTF(E0) associated with the resolution of the electro-optical system is set to 0.55 or more. In this way, it is possible to prevent the degradation of MTF (total) to appropriately detect a defect even if the defect is approximately one-half of the pixel size (=minimum line width).

Alternatively, instead of preventing the degradation of MTF(total) as described above, defects smaller than the pixel size can also be detected by sufficiently increasing an S/N ratio when a pattern image is captured. For detecting a defect having a size similar to the pixel size, it is said that the S/N ratio is required to be 15 or higher where the noise is calculated as 3σ, as described in Hiroyuki Shinada et al. Based on this point, MTF(pixel) is degraded to 0.41/0.64 times when detecting a defect having a size one-half of the pixel size, so that the S/N ratio should be multiplied by the inverse of 0.41/0.64:

$$S/N = 15 \times 0.64/0.41$$
$$= 23.4$$

Consequently, it is possible to detect a defect having a size one-half of the pixel size (=minimum line width). In other words, when the S/N ratio is set to about 20 or higher, it is possible to detect a defect approximately one-half of the pixel size.

For detecting a defect one-third of the pixel size (i.e., $d_{pix}/(2d_{def})$=1.5), MTF(pixel) should be approximately 0.21, as shown in FIG. 11B. Therefore, it is possible to detect a defect one-third of the pixel size, provided that a required S/N ratio:

15×0.64/0.21=45.7 is ensured.

Now, description will be made on an exemplary modification to the electron beam apparatus illustrated in FIG. 1A for detecting defects based on the principles as discussed above.

Since each of the electron guns 100 comprises a mechanical alignment mechanism as described above, they can be aligned independently of one another. For alignment, the anode electrode 10 is applied with a wobble voltage, which is a periodically changing voltage, while monitoring a beam emitted from each electron gun 100. Namely, the deflector 12 is manipulated to scan the beam on the shaping aperture plate 13 to adjust the optical axis O1 of the beam based on a movement of a bright region due to an absorbed current measured on the aperture plate 16.

The cathode 1, which is a $LaB_6$ cathode, provides the brightness of $1 \times 10^6$ A/cm²SR as mentioned above, so a beam current of 20 nA with a beam diameter of 100 nm is obtained on a sample S. Further, the electron gun 100 may be configured to operate in a space charge limiting region to realize a shot noise reduction coefficient Γ equal to 0.25 (Γ=0.25).

In the electron beam apparatus as described above, when an electron beam is scanned at a clock frequency of 100 MHz, the number N of detected secondary electrons per pixel is calculated as follows. Note, however, that defects intended for detection are equal to or larger than the pixel size:

$$N = 20 \times 10^{-9} / (100 \times 10^6 \times 1.6 \times 10^{-19})$$
$$= 1{,}250$$

The resulting $S/N$ ratio is:

$$S/N = 1/\Gamma \times \sqrt{(N/2)}/3$$
$$= 33.4$$

(where 1/Γ is set to 4.0)

As mentioned above, the S/N ratio of 15 or higher permits the detection of defects of 100 nm size equal to the pixel size, and accordingly enables the detection of defects equal to or larger than the pixel size with a high accuracy.

As to the detection of defects smaller than the pixel size, the S/N ratio equal to 33.4 permits a highly accurate detection of defects one-half of the pixel size even if MTF(pixel) is degraded.

Further, when the beam diameter is set to 45 nm instead of 100 nm, the resulting beam current decreases to 0.82 nA. Then, scanning at a clock frequency of 100 MHz results in the S/N ratio equal to 18.75 (>15). From the graph of FIG. 12, MTF(E0)=0.85 when beam diameter/CD=0.45, while from the graph of FIG. 11B, MTF(pixel)=0.41, so that the total MTF is calculated as follows:

$$MTF(\text{total}) = 0.85 \times 0.41$$
$$= 0.35$$

As previously described in connection with FIG. 12, MTF=0.35 is the optimal value. Accordingly, defects equal to the pixel size can be detected under this condition. Also, even if MTF(pixel) is reduced to 0.41 by the reduction of the defect size to one half, MTF(total) equal to 0.35 can be ensured. It is therefore possible to detect defects even having a diameter of around 50 nm.

Figure 13:
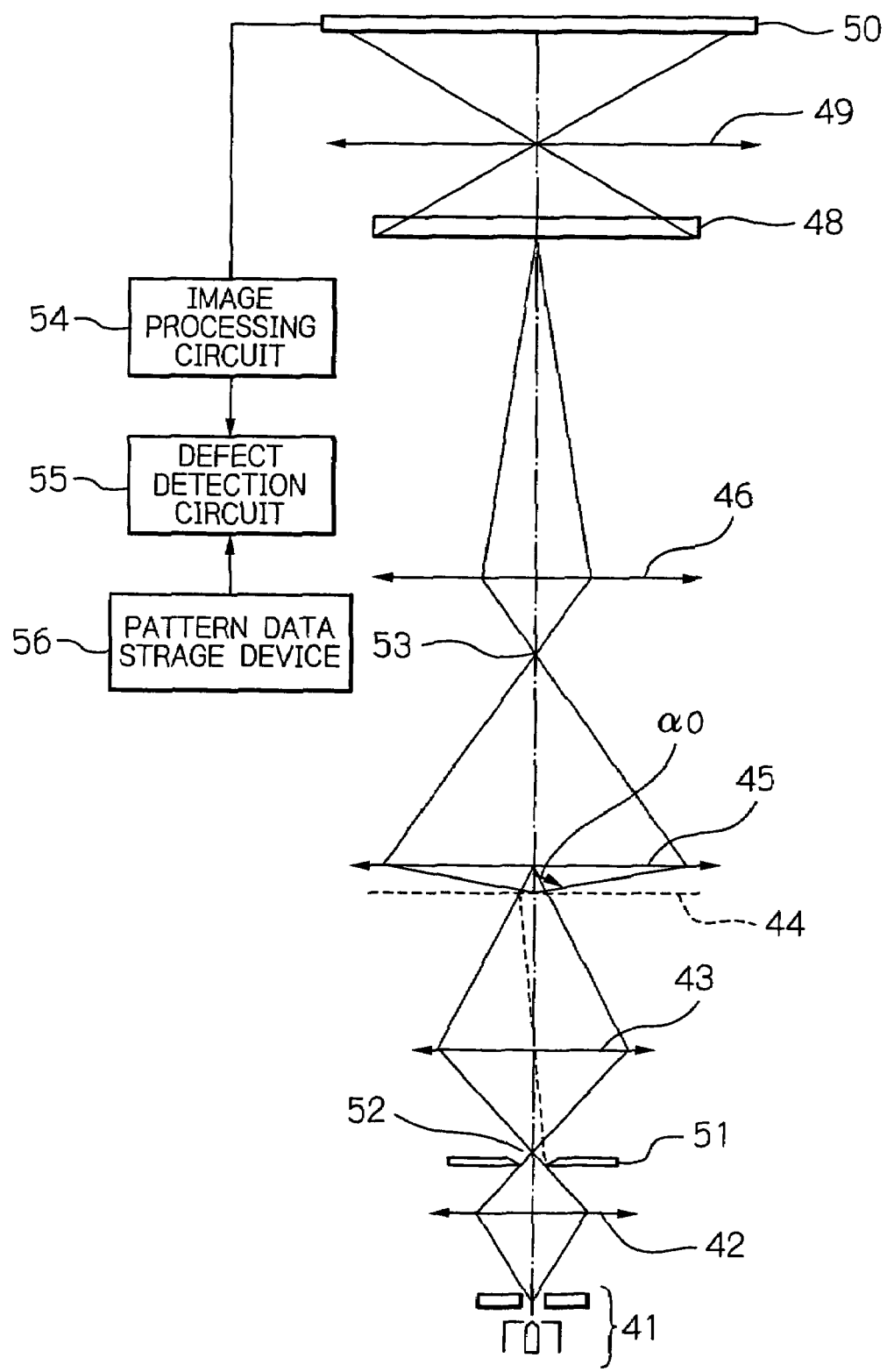
FIG. 13 is a schematic diagram illustrating a main portion of another embodiment of an electron beam apparatus according to the present invention.

FIG. 13 illustrates a main portion of another embodiment of the electron beam apparatus according to the present invention, which can improve the throughput by increasing the pixel size, and can accurately detect even small defects. This embodiment is intended for a defect detecting apparatus for a stencil mask or a membrane mask. An electron beam emitted from an electron gun 41 forms a cross-over 52 by a condenser lens 42, and forms a cross-over near the main surface of an objective lens 45 in a magnifying lens system by an irradiation lens 43. A mask under inspecting is positioned near a front stage of an objective lens 45. The irradiation lens 43 is provided with an aperture plate 51 having a rectangular aperture through its objective plane, such that the electron beam is irradiated only onto a region of the mask 44 requisite for the inspection through the rectangular aperture.

The mask 44 is irradiated with the electron beam of uniform intensity, and the electron beam passing through the mask 44 is enlarged by the objective lens 45 to form an enlarged image at a position 53 in front of the magnifying lens 46. Then, the image is further enlarged by the magnifying lens 46 to form a light image on a vacuum window 48 which has an fluorescent region on the inner surface.

Then, the image, the size of which is adjusted by a light optical lens system 49, is focused on a TDI camera 50 which transduces the image into an electric signal. The electric signal is next converted to a mask image in an image processing circuit 54. Subsequently, defects may be detected on the mask image in a defect detector circuit 55. The defect detector circuit 55 is provided with data on a reference mask pattern from a pattern data storage device 56, so that the defect detector circuit 55 compares the reference mask pattern with data from the image forming circuit 54 to detect defects.

The electron gun 41, which has a LaB$_6$ cathode, is configured to operate under a space charge limiting condition, so that shot noise is reduced by a factor of two to five, as compared with a normal counterpart which employs a Schottky cathode. The brightness of 1×10³ A/cm²SR (4.5 kV) can be readily accomplished. Since the magnifying lens system 45 provides a beam diameter of 20 nm with an irradiation angle $\alpha_0 m$ of 3 mrad, the mask 44 may be irradiated at $\alpha_0 m=2.5$ mrad to provide the following number N of electrons and S/N ratio for a pixel of 50 nm/square:

$$N = \pi\alpha^2 (50 \times 10^{-7})^2 \times 1 \times 10^3 \times 2048 \times 512 /$$
$$(800 \times 10^6 \times 1.6 \times 10^{-19})$$
$$= 4021$$

$$S/N = 1/\Gamma \times \sqrt{(N/2)}/3$$
$$= 29.9 \text{ (where } 1/\Gamma = 2)$$

Again, in this event, the S/N ratio is higher than 20, permitting the detection of defects equal to or smaller than one-half of the pixel size.

Figure 14:
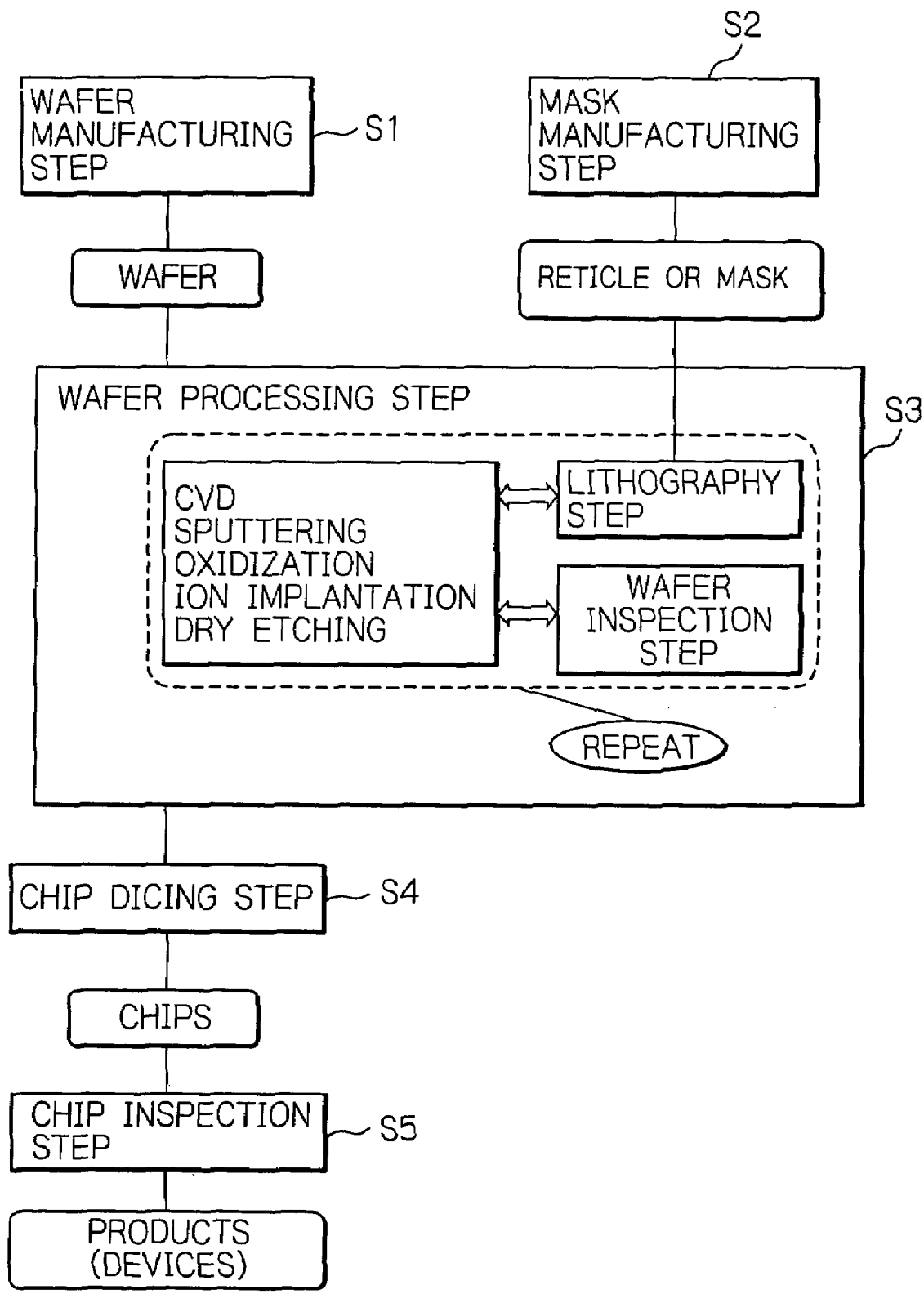
FIG. 14 is a flow chart illustrating a method of manufacturing semiconductor devices, to which an electron beam apparatus according to the present invention is applicable.

FIG. 14 shows a flowchart for explaining a method of manufacturing semiconductor devices which includes procedures for inspecting or evaluating semiconductor wafers in the middle of a manufacturing process or after the process using the electron beam apparatus of the present invention.

As illustrated in FIG. 14, the method of manufacturing semiconductor devices a, when generally divided, comprises a wafer manufacturing step S1 of manufacturing a wafer (or a wafer preparation step of preparing a wafer); a mask manufacturing step S2 of manufacturing a mask required for exposure (or a mask preparation step of preparing a mask); a wafer processing step S3 of processing a wafer as required; a chip assembly step S4 of dicing chips formed on a wafer one by one and bringing each chip into an operable state; and a chip inspection step S5 of inspecting the finished chips.

Each of the steps may include several sub-steps. In the respective steps, a step which exerts a critical influence to the manufacturing of semiconductor devices is the wafer processing step S3. This is because designed circuit patterns are formed on a wafer, and a multiplicity of chips which operate as a memory and MPU are formed in this step. It is therefore important to evaluate a processed state of a wafer executed in sub-steps of the wafer processing step which influences the manufacturing of semiconductor devices. Such sub-steps will be described below.

First, a dielectric thin film serving as an insulating layer is formed, and a metal thin film is formed for forming wires and electrodes. The thin films are formed by CVD, sputtering or the like. Next, the formed dielectric thin film and metal thin film, and a wafer substrate are oxidized, and a mask or a reticle created in the mask manufacturing step S503 is used to form a resist pattern in a lithography step. Then, the substrate is processed in accordance with the resist pattern by a dry etching technique or the like, followed by injection of ions and impurities. Subsequently, a resist layer is stripped off, and the wafer is inspected.

The wafer processing step as described is repeated the number of times equal to the number of required layers to form a wafer before it is separated into chips in the chip assembly step S4.

Figure 15:
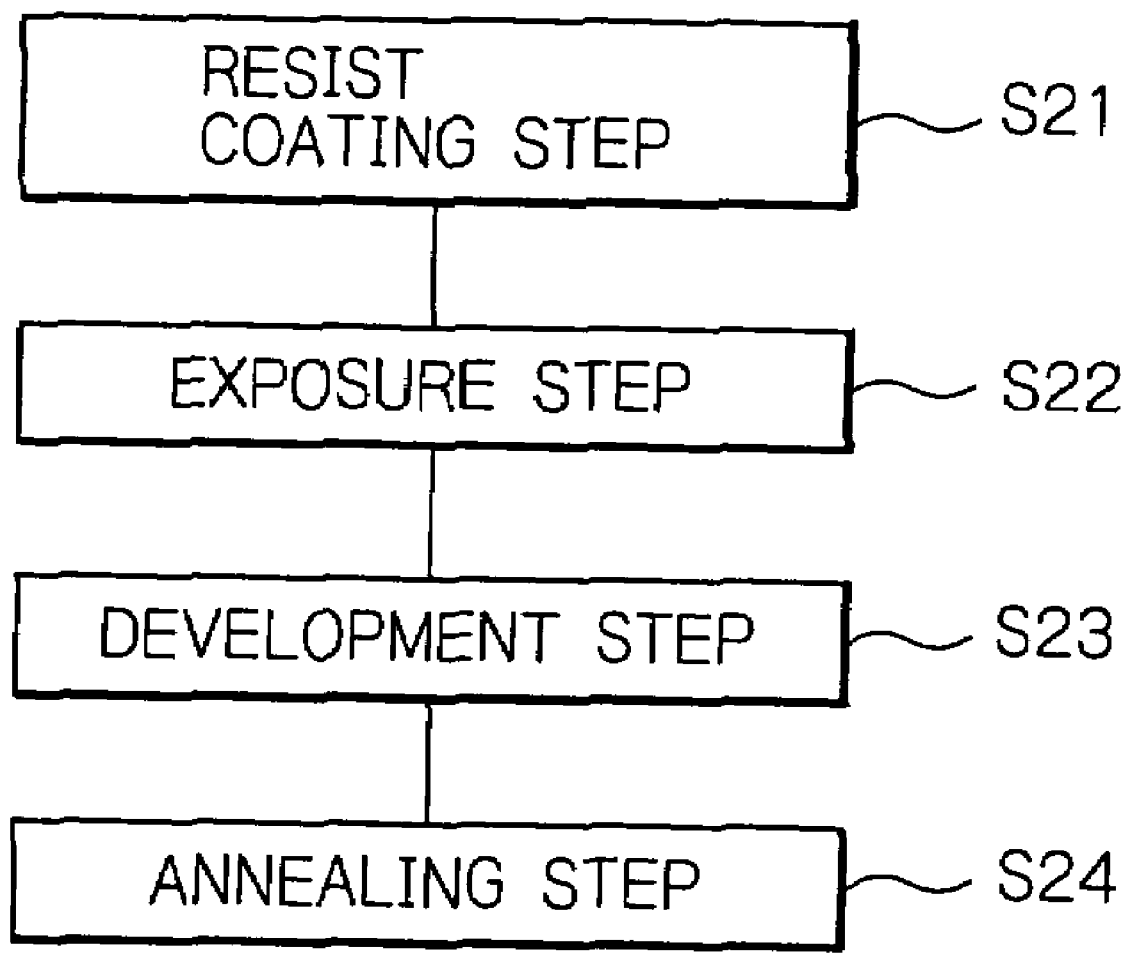
FIG. 15 is a flow chart illustrating a lithography process in the semiconductor device manufacturing method illustrated in FIG. 14.

FIG. 15 is a flow chart illustrating the lithography step which is a sub-step of the wafer processing step in FIG. 14. As illustrated in FIG. 14, the lithography step includes a resist coating step S21, an exposure step S22, a development step S23, and an annealing step S24. Namely, in step S21, a resist is coated on a wafer formed with circuit patterns using CVD or sputtering, and thereafter the coated resist is exposed in step S22. Then, in step S23, the exposed resist is developed to create a resist pattern, and thereafter, the developed resist pattern is annealed for stabilization in step S24. These steps S21 through S24 are repeated the number of times equal to the number of required layers.

In the process of manufacturing semiconductor devices, an inspection or evaluation is conducted for defects and the like in the processing step S3 and chip inspection step S7, using the electron beam apparatus according to the present invention. Since the electron beam apparatus can present a high throughput of the inspection, the semiconductor devices themselves can be manufactured at a high throughput. It is therefore possible to improve the yield rate of products and prevent defective products from being shipped.

The electron beam apparatus according to the present invention, which is configured as described above, can provide the following advantageous effects.

(1) Since each of cathodes can be aligned to the associated anode in electron guns with a high accuracy by the adjusting mechanism, the optical axis adjustments can be made when a large number of optical systems are used and even if some of the electron guns are manufactured with low accuracies.

(2) When a metal part is provided near each of cathode for reflecting radiations emitted from the cathode back to the vicinity of the tip of the cathode, a majority of the radiations emitted from the cathode and a filament for thermaling the cathode can be confined within a space surrounded by the Wehnelt and metal part. Thus, the radiations are prevented from thermaling the components of the optical system, insulating glass and vacuum wall, and the cathode can be thermaled to a required temperature with less electric power.

(3) Since an Wehnelt of each electron gun can be applied with an individually independent voltage, the brightness of a primary electron beam emitted from each electron gun can be adjusted to match the brightness with those of the remaining electron guns.

(4) Since a high vacuum can be readily produced, thermaling power can be relatively reduced even if a plurality of optical systems are disposed in close proximity to one another.

(5) Since each lens is comprised of the thin plate section and beam structure section of a relatively large thickness, even a thin electrode can be assembled without bowing. In addition, since each lens can be adjusted for the focal distance independently, a plurality of lenses can be adjusted on a one-by-one basis.

(6) Since an E×B separator has an electromagnetic deflector made of permanent magnets, a lead wire is eliminated to simplify the structure. Also, a large number of E×B separators can be disposed in a fixed region.

(7) When a majority of lead wires is made by lithography etching, the assembly is facilitated.

(8) When all insulation surfaces possibly exposed to electron beams are shielded, stable electron beams can be generated.

(9) Shot noise can be reduced when a cathode operates in the spatial charge limiting region.

(10) Even if a sample is scanned at a relatively high clock frequency, for example, 100 MHz or more, it is possible to detect defects approximately one-half or one-third of a pixel size with a high accuracy, and therefore detect relatively small defects with a high accuracy while maintaining a high throughput.

(11) Conversely, since the pixel size can be set twice or more as much as the size of intended defects, a high throughput can also be provided in this sense.

(12) It is possible to employ a reliable secondary electron detector such as an electron detector which uses a scintillator and PMT, thereby improving the reliability of the electron beam apparatus.

(13) When defects are detected on a stencil mask, defects smaller than a pixel size can be readily detected because of small MTF and a high S/N ratio of a signal generated from TDI when it employed in an electron detector.

(14) When the electron beam apparatus according to the present invention is applied to a method of manufacturing semiconductor devices for use in mask or wafer detect inspection steps, the inspection can be made at a high throughput even on semiconductor devices having fine patterns, thereby providing for total inspection, improved yield rate of products, and prevention of shipment of defective products.

While the preferred embodiments of the present invention have been described, it should be apparent to those skilled in the art that the present invention is not limited to the foregoing embodiments and can be altered and modified in various ways.

What is claimed is:

1. An electron beam apparatus for inspecting a sample, comprising:
   a plurality of electron guns for emitting a plurality of primary electron beams; and
   a plurality of lenses respectively corresponding to the electron guns, for converging the primary electron beams emitted from the electron guns, wherein
   the lenses comprises a plurality of laminated insulation plates each of which has throughholes at portions respectively corresponding to optical axes of the primary electron beams, and
   each of the laminated insulation plates has a plurality of lens electrodes made by dividing a metal coating layer on the insulation plate correspondingly to the throughholes therein.

2. An electron beam apparatus for inspecting a sample, comprising:
   a plurality of electron guns for emitting a plurality of primary electron beams; and
   a plurality of electro-magnetic deflectors respectively corresponding to the electron guns, for deflecting secondary electron beams emitted from the sample, wherein
   each of the electro-magnetic deflectors comprises:
      a pair of ferromagnetic materials located at opposing sides on a circle and having an arc shape; and
      a pair of permanent magnets located at opposing sides on the circle, the same poles of the respective permanent magnets facing each other to generate magnetic flexes in opposing directions.

3. An electron beam apparatus for inspecting a sample, comprising:
   a plurality of electron guns for emitting a plurality of primary electron beams;
   a plurality of E×B separators respectively corresponding to the electron guns, for separating secondary electrons emitted from the sample from primary optical systems, wherein
   the E×B separators comprise:
      a plurality of electrostatic deflectors comprising throughholes provided at potions of an insulation plate correspondingly to axes of the primary electron beams, and a plurality of electrodes in grooves which divide portions around the respective throughholes of the insulation plate; and
      a plurality of electromagnetic deflectors respectively located around the electrostatic deflectors.

\* \* \* \* \*